(12) United States Patent
Yokoyama et al.

(10) Patent No.: US 11,502,006 B2
(45) Date of Patent: Nov. 15, 2022

(54) APPARATUSES HAVING AN INTERCONNECT EXTENDING FROM AN UPPER CONDUCTIVE STRUCTURE, THROUGH A HOLE IN ANOTHER CONDUCTIVE STRUCTURE, AND TO AN UNDERLYING STRUCTURE

(71) Applicant: Micron Technology, Inc., Boise, ID (US)

(72) Inventors: Nanae Yokoyama, Kanagawa (JP); Ryota Suzuki, Kanagawa (JP); Makoto Sato, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 74 days.

(21) Appl. No.: 16/427,878

(22) Filed: May 31, 2019

(65) Prior Publication Data
US 2019/0304847 A1   Oct. 3, 2019

Related U.S. Application Data

(63) Continuation of application No. 15/835,210, filed on Dec. 7, 2017, now Pat. No. 10,410,934.

(51) Int. Cl.
| | |
|---|---|
| *H01L 21/768* | (2006.01) |
| *H01L 21/8238* | (2006.01) |
| *H01L 23/528* | (2006.01) |
| *H01L 27/092* | (2006.01) |

(52) U.S. Cl.
CPC ........ *H01L 21/823892* (2013.01); *H01L 21/76805* (2013.01); *H01L 21/76832* (2013.01); *H01L 21/76867* (2013.01); *H01L 21/76883* (2013.01); *H01L 23/5283* (2013.01); *H01L 23/5286* (2013.01); *H01L 27/092* (2013.01)

(58) Field of Classification Search
CPC .......... H01L 29/66825; H01L 29/7841; H01L 27/0207; H01L 23/528; H01L 21/823892; H01L 21/76805; H01L 21/76832; H01L 21/76867; H01L 21/76883; H01L 23/5283; H01L 23/5226; H01L 23/5329; H01L 23/552; H01L 23/565; G05F 3/02; G05F 3/205
See application file for complete search history.

(56) References Cited

U.S. PATENT DOCUMENTS

| | | | | |
|---|---|---|---|---|
| 4,225,900 A | * | 9/1980 | Ciccio ............... | H05K 1/144 257/700 |
| 4,672,584 A | * | 6/1987 | Tsuji ............... | H01L 27/0921 365/226 |
| 4,840,923 A | * | 6/1989 | Flagello ............ | H01L 21/4846 148/DIG. 164 |
| 5,248,633 A | * | 9/1993 | Morar ............... | H01L 21/3105 438/533 |
| 5,376,816 A | * | 12/1994 | Nishigoori ......... | H01L 27/0623 257/370 |

(Continued)

*Primary Examiner* — Sophia T Nguyen
(74) *Attorney, Agent, or Firm* — Wells St. John P.S.

(57) ABSTRACT

Some embodiments include an apparatus having a well region extending into a semiconductor substrate. A first conductive element is over the well region, and a second conductive element is over the first conductive element. A hole extends through the first conductive element. A connecting element extends from the second conductive element to the well region, and passes through the hole.

26 Claims, 7 Drawing Sheets

(56) References Cited

U.S. PATENT DOCUMENTS

| | | | | |
|---|---|---|---|---|
| 5,432,999 A * | 7/1995 | Capps | G11C 5/02 | 438/109 |
| 5,439,848 A * | 8/1995 | Hsu | H01L 23/5283 | 257/E21.575 |
| 5,506,434 A * | 4/1996 | Yonemoto | H01L 27/14825 | 257/291 |
| 5,538,433 A * | 7/1996 | Arisaka | H05K 1/0218 | 174/266 |
| 5,714,796 A * | 2/1998 | Chishiki | H01L 27/11898 | 257/544 |
| 5,736,679 A * | 4/1998 | Kresge | H05K 1/0271 | 174/250 |
| 5,739,587 A * | 4/1998 | Sato | H01L 24/03 | 257/758 |
| 5,760,429 A | 6/1998 | Yano et al. | | |
| 5,777,276 A * | 7/1998 | Zhu | H05K 1/0265 | 174/263 |
| 5,867,418 A * | 2/1999 | Okasaka | G11C 5/14 | 257/344 |
| 5,942,784 A * | 8/1999 | Harima | H01L 27/0921 | 257/372 |
| 5,986,343 A * | 11/1999 | Chittipeddi | H01L 24/05 | 257/758 |
| 5,998,251 A * | 12/1999 | Wu | H01L 27/10852 | 257/E21.648 |
| 6,011,681 A * | 1/2000 | Ker | H01L 27/0251 | 361/111 |
| 6,020,614 A * | 2/2000 | Worley | H01L 21/761 | 257/349 |
| 6,022,797 A * | 2/2000 | Ogasawara | H01L 23/5226 | 438/622 |
| 6,184,477 B1 * | 2/2001 | Tanahashi | H01L 23/50 | 174/261 |
| 6,222,270 B1 * | 4/2001 | Lee | H01L 24/03 | 257/758 |
| 6,236,595 B1 * | 5/2001 | Gerber | G11C 16/0425 | 365/185.18 |
| 6,246,118 B1 * | 6/2001 | Buynoski | H01L 23/4821 | 257/758 |
| 6,291,331 B1 * | 9/2001 | Wang | H01L 21/76801 | 257/E21.576 |
| 6,294,834 B1 * | 9/2001 | Yeh | H01L 23/4825 | 257/347 |
| 6,309,940 B1 * | 10/2001 | Lee | H01L 27/0921 | 438/370 |
| 6,365,951 B1 * | 4/2002 | Worley | H01L 33/0004 | 250/214 LA |
| 6,388,205 B1 * | 5/2002 | Chua | H05K 1/0221 | 174/261 |
| 6,448,641 B2 * | 9/2002 | Ker | H01L 23/5222 | 257/700 |
| 6,448,650 B1 * | 9/2002 | Saran | H01L 24/03 | 257/750 |
| 6,462,978 B2 * | 10/2002 | Shibata | H01L 27/0207 | 365/63 |
| 6,489,202 B1 * | 12/2002 | Hsu | H01L 27/105 | 257/E21.689 |
| 6,489,228 B1 * | 12/2002 | Vigna | H01L 23/585 | 438/612 |
| 6,489,689 B2 * | 12/2002 | Nojiri | H01L 24/06 | 257/E23.152 |
| 6,576,550 B1 * | 6/2003 | Brase | H01L 21/76808 | 257/E21.579 |
| 6,583,001 B1 | 6/2003 | Burr | | |
| 6,707,139 B2 * | 3/2004 | Fujii | G11C 5/025 | 257/207 |
| 6,717,270 B1 * | 4/2004 | Downey | H01L 23/50 | 257/758 |
| 6,740,985 B1 * | 5/2004 | Zhao | H01L 24/03 | 257/758 |
| 6,774,412 B2 * | 8/2004 | Komaki | H01L 27/11807 | 257/207 |
| 6,800,169 B2 * | 10/2004 | Liu | B32B 7/12 | 156/292 |
| 6,803,268 B2 * | 10/2004 | Nagai | H01L 27/115 | 257/E21.682 |
| 6,861,752 B2 * | 3/2005 | Kajiyama | H01L 27/228 | 257/758 |
| 6,909,196 B2 * | 6/2005 | Batra | H01L 23/5222 | 257/503 |
| 6,927,429 B2 * | 8/2005 | Chun | H01L 27/0203 | 257/204 |
| 6,933,224 B2 * | 8/2005 | Nejad | H01L 23/5226 | 438/622 |
| 7,013,436 B1 * | 3/2006 | Morton | H01L 23/5286 | 257/532 |
| 7,160,795 B2 * | 1/2007 | Batra | H01L 23/5222 | 257/E23.02 |
| 7,259,333 B2 * | 8/2007 | Japp | H05K 3/4641 | 174/255 |
| 7,274,247 B2 * | 9/2007 | Ward | H03K 19/0016 | 327/534 |
| 7,281,231 B2 * | 10/2007 | Kan | H01L 23/522 | 257/E23.142 |
| 7,314,788 B2 * | 1/2008 | Shaw | H01L 27/11807 | 257/E21.135 |
| 7,365,376 B2 * | 4/2008 | Ohayashi | H01L 27/0203 | 257/203 |
| 7,368,789 B1 * | 5/2008 | Dhaoui | G11C 16/0433 | 257/314 |
| 7,495,343 B1 * | 2/2009 | Singh | H01L 23/5226 | 257/758 |
| 7,626,268 B2 * | 12/2009 | Goebel | H01L 24/03 | 257/774 |
| 7,834,428 B2 * | 11/2010 | Secareanu | H01L 27/092 | 257/665 |
| 7,853,913 B2 * | 12/2010 | Selvaraj | G03F 7/70433 | 716/50 |
| 7,902,611 B1 * | 3/2011 | Rahim | H01L 21/823892 | 257/374 |
| 8,102,053 B2 * | 1/2012 | Matsubara | H01L 22/34 | 257/48 |
| 8,252,642 B2 * | 8/2012 | Morris | H01L 21/743 | 438/224 |
| 8,471,357 B2 * | 6/2013 | Huang | H01L 28/10 | 257/531 |
| 8,592,987 B2 * | 11/2013 | Barth | H01L 23/481 | 257/758 |
| 8,749,022 B2 * | 6/2014 | Chang | H01L 29/94 | 257/532 |
| 8,803,206 B1 * | 8/2014 | Or-Bach | H01L 25/0657 | 257/278 |
| 9,189,585 B2 * | 11/2015 | Hunter | H01L 24/05 | |
| 9,437,591 B1 * | 9/2016 | Nidhi | H01L 27/0266 | |
| 9,466,579 B2 * | 10/2016 | Hochstenbach | H01L 23/3192 | |
| 9,553,508 B1 * | 1/2017 | Chu | H01L 27/0266 | |
| 9,659,859 B2 * | 5/2017 | Chen | H01L 23/481 | |
| 9,871,034 B1 * | 1/2018 | Or-Bach | H01L 27/04 | |
| 9,906,224 B1 * | 2/2018 | Chu | H01L 27/092 | |
| 10,103,053 B1 * | 10/2018 | Sukekawa | H01L 21/76898 | |
| 10,157,925 B1 * | 12/2018 | Kuo | H01L 27/0921 | |
| 10,410,934 B2 * | 9/2019 | Yokoyama | H01L 21/823892 | |
| 10,916,551 B2 * | 2/2021 | Liaw | H01L 27/1104 | |
| 2001/0015595 A1 * | 8/2001 | Funahara | H03H 9/1014 | 310/348 |
| 2001/0015781 A1 * | 8/2001 | Tanaka | G02F 1/133553 | 349/113 |
| 2001/0043487 A1 * | 11/2001 | Nii | G11C 8/16 | 257/E27.099 |
| 2001/0045670 A1 * | 11/2001 | Nojiri | H01L 23/5283 | 257/786 |
| 2002/0074660 A1 * | 6/2002 | Fukasawa | H01L 21/76838 | 257/758 |
| 2002/0105083 A1 * | 8/2002 | Sun | H05K 1/0218 | 257/758 |
| 2002/0118523 A1 * | 8/2002 | Okabe | H01L 21/4857 | 361/793 |

(56) References Cited

U.S. PATENT DOCUMENTS

| | | | |
|---|---|---|---|
| 2002/0157082 A1* | 10/2002 | Shau | G01R 31/2856 716/50 |
| 2002/0158337 A1* | 10/2002 | Babich | H01L 21/7681 257/750 |
| 2003/0051218 A1* | 3/2003 | Kumagai | G06F 30/394 257/774 |
| 2003/0112576 A1* | 6/2003 | Brewer | H01L 24/24 361/119 |
| 2003/0143768 A1* | 7/2003 | Chen | G02F 1/136277 438/30 |
| 2004/0016981 A1* | 1/2004 | Yoshida | G01P 15/123 257/414 |
| 2004/0159858 A1* | 8/2004 | Chun | H01L 27/0203 257/204 |
| 2004/0195625 A1* | 10/2004 | Ichikawa | H01L 27/1203 257/347 |
| 2004/0232497 A1* | 11/2004 | Akiyama | H01L 23/5223 257/390 |
| 2005/0012155 A1* | 1/2005 | Ker et al. | H01L 23/62 257/355 |
| 2005/0037604 A1* | 2/2005 | Babich | H01L 21/7681 438/619 |
| 2005/0051801 A1* | 3/2005 | Shaw | H01L 27/11807 257/202 |
| 2005/0074916 A1* | 4/2005 | Sun | H01L 27/14601 438/60 |
| 2005/0098893 A1* | 5/2005 | Tsutsue | H01L 23/564 257/758 |
| 2005/0265072 A1* | 12/2005 | Hart | G11C 13/0004 365/163 |
| 2006/0033167 A1* | 2/2006 | Novosel | H01L 21/76838 257/369 |
| 2006/0145792 A1* | 7/2006 | Hsu | H01H 59/0009 335/78 |
| 2006/0192288 A1* | 8/2006 | Ueno | H01L 23/5225 257/758 |
| 2006/0215337 A1* | 9/2006 | Wu | H01L 27/0262 361/56 |
| 2006/0291321 A1* | 12/2006 | Leung | G11C 8/08 365/230.06 |
| 2007/0044057 A1* | 2/2007 | Kitani | H01L 23/552 257/784 |
| 2007/0045665 A1* | 3/2007 | Park | H01L 27/14623 257/204 |
| 2007/0080430 A1* | 4/2007 | Yoshida | H01L 27/11807 257/662 |
| 2007/0170516 A1* | 7/2007 | Cecchi | H01L 29/1087 257/371 |
| 2007/0242202 A1* | 10/2007 | Kawase | H01L 27/3276 349/139 |
| 2007/0280012 A1* | 12/2007 | Obayashi | G11C 17/165 365/200 |
| 2008/0001192 A1* | 1/2008 | Inoue | H01L 27/14647 257/291 |
| 2008/0079461 A1* | 4/2008 | Lin | H01L 23/5283 326/101 |
| 2008/0080112 A1* | 4/2008 | Lin | H01L 23/5283 361/56 |
| 2008/0099873 A1* | 5/2008 | Vora | H01L 27/11 257/E27.098 |
| 2008/0128756 A1* | 6/2008 | Satoh | H01L 27/0928 257/203 |
| 2008/0175084 A1* | 7/2008 | Akiyama | H01L 27/10897 365/208 |
| 2008/0258771 A1* | 10/2008 | Tachibana | H01L 27/0921 326/98 |
| 2010/0019295 A1* | 1/2010 | Henderson | H01L 31/107 257/292 |
| 2010/0025761 A1* | 2/2010 | Voidman | H01L 29/1083 257/338 |
| 2010/0123253 A1* | 5/2010 | Ooka | H01L 27/0207 257/773 |
| 2011/0095338 A1* | 4/2011 | Scheuerlein | G11C 5/06 430/5 |
| 2011/0127549 A1* | 6/2011 | Lee | H01L 33/06 257/E33.074 |
| 2011/0260335 A1* | 10/2011 | Takeshima | H01L 23/5286 257/774 |
| 2012/0043595 A1* | 2/2012 | Chang | H01L 29/92 257/E29.345 |
| 2012/0126285 A1* | 5/2012 | Campi, Jr | H01L 21/823892 257/173 |
| 2012/0156842 A1* | 6/2012 | Jung | H01L 27/11558 438/258 |
| 2012/0282779 A1* | 11/2012 | Arnold | H01L 21/76885 257/E21.214 |
| 2012/0294083 A1* | 11/2012 | Banna | G11C 16/0483 365/185.08 |
| 2012/0305874 A1* | 12/2012 | Hern | H01L 27/2409 257/43 |
| 2012/0306013 A1* | 12/2012 | Donovan | H01L 27/0285 257/338 |
| 2013/0003437 A1* | 1/2013 | Siau | G11C 11/5685 365/148 |
| 2013/0049156 A1* | 2/2013 | Furukawa | H01L 27/14645 257/443 |
| 2013/0075856 A1* | 3/2013 | Tsai | H01L 27/0251 257/503 |
| 2013/0146974 A1* | 6/2013 | Kim | H01L 29/7801 257/335 |
| 2013/0182495 A1* | 7/2013 | Deng | G11C 11/412 365/156 |
| 2013/0228869 A1* | 9/2013 | Masuoka | H01L 27/1104 257/368 |
| 2013/0256801 A1* | 10/2013 | Yen | H01L 27/0928 257/357 |
| 2013/0330884 A1* | 12/2013 | Salcedo | H01L 21/8222 438/133 |
| 2014/0015061 A1* | 1/2014 | Pelley | H01L 23/5226 257/E27.098 |
| 2014/0042620 A1* | 2/2014 | Mizukami | H01L 21/76883 257/737 |
| 2014/0062844 A1* | 3/2014 | Yamamoto | G09G 3/3225 345/80 |
| 2014/0092669 A1* | 4/2014 | Chen | H01L 45/12 257/2 |
| 2014/0124889 A1* | 5/2014 | Qian | H01L 27/14618 257/448 |
| 2014/0197883 A1* | 7/2014 | Sinha | G05F 3/02 327/537 |
| 2014/0256062 A1* | 9/2014 | Kim | H01L 27/228 438/3 |
| 2014/0264680 A1* | 9/2014 | Kim | H01L 43/08 257/427 |
| 2014/0333339 A1* | 11/2014 | Orr | G01R 1/07378 324/756.02 |
| 2014/0342529 A1* | 11/2014 | Goktepeli | H01L 27/1203 438/458 |
| 2015/0048518 A1* | 2/2015 | Chen | H01L 23/3171 257/774 |
| 2015/0171069 A1* | 6/2015 | Su | H01L 21/823871 257/369 |
| 2015/0243646 A1* | 8/2015 | Kakubari | H01L 29/7412 257/133 |
| 2015/0303270 A1* | 10/2015 | Liaw | H01L 23/528 257/9 |
| 2015/0348962 A1* | 12/2015 | Chao | H01L 23/5283 257/207 |
| 2015/0357338 A1* | 12/2015 | Pelley | H01L 23/5226 438/637 |
| 2015/0364420 A1* | 12/2015 | Lin | H01L 23/5283 257/775 |
| 2016/0027499 A1* | 1/2016 | Liaw | G11C 8/16 365/154 |
| 2016/0049198 A1* | 2/2016 | Darla | G11C 15/04 365/49.17 |
| 2016/0071849 A1* | 3/2016 | Singhal | H01L 27/092 327/537 |

(56) References Cited

U.S. PATENT DOCUMENTS

| | | | |
|---|---|---|---|
| 2016/0155841 A1* | 6/2016 | Huo | H01L 29/1083 |
| | | | 257/339 |
| 2016/0181255 A1* | 6/2016 | Nii | G11C 8/16 |
| | | | 257/369 |
| 2016/0268220 A1* | 9/2016 | Tsai | H01L 27/14621 |
| 2016/0300830 A1* | 10/2016 | Salcedo | H01L 27/0259 |
| 2016/0327502 A1* | 11/2016 | Chen | G01R 27/2605 |
| 2016/0372418 A1* | 12/2016 | Utsumi | H01L 23/485 |
| 2017/0062417 A1* | 3/2017 | Chun | H01L 23/528 |
| 2017/0148784 A1* | 5/2017 | Xu | H01L 23/5227 |
| 2017/0162558 A1* | 6/2017 | Chu | H01L 27/0292 |
| 2017/0186786 A1* | 6/2017 | Hsu | H01L 31/02327 |
| 2017/0207239 A1* | 7/2017 | Liaw | H01L 27/092 |
| 2017/0221818 A1* | 8/2017 | Lau | H01L 23/528 |
| 2017/0221905 A1* | 8/2017 | Chen | H01L 27/11582 |
| 2017/0256588 A1* | 9/2017 | Fukuda | H01L 27/2481 |
| 2017/0365414 A1* | 12/2017 | Tanaka | H03M 1/1061 |
| 2018/0033793 A1* | 2/2018 | Balakrishnan | H01L 29/41741 |
| 2018/0076134 A1* | 3/2018 | Jing | H01L 23/5225 |
| 2018/0211954 A1* | 7/2018 | Ahmad | H01L 29/93 |
| 2018/0226390 A1* | 8/2018 | Kang | H01L 25/0657 |
| 2018/0323502 A1* | 11/2018 | Lee | H01Q 1/36 |
| 2018/0351099 A1* | 12/2018 | Yang | H01L 27/2436 |
| 2018/0358409 A1* | 12/2018 | Hsieh | H01L 45/145 |
| 2019/0013294 A1* | 1/2019 | Sasaki | H01L 23/528 |
| 2019/0043804 A1* | 2/2019 | Qian | H01L 21/76808 |
| 2019/0103471 A1* | 4/2019 | Aghoram | H01L 29/42336 |
| 2019/0131965 A1* | 5/2019 | Kurachi | H03K 17/08104 |
| 2019/0148407 A1* | 5/2019 | Guo | H01L 29/6681 |
| | | | 257/206 |
| 2019/0157983 A1* | 5/2019 | Lee | H02M 1/143 |
| 2019/0181053 A1* | 6/2019 | Yokoyama | H01L 21/76805 |
| 2019/0206736 A1* | 7/2019 | Sills | H01L 23/5226 |
| 2019/0206893 A1* | 7/2019 | Liaw | H01L 27/11807 |
| 2019/0287897 A1* | 9/2019 | Guo | H01L 27/0207 |
| 2019/0304847 A1* | 10/2019 | Yokoyama | H01L 23/5283 |
| 2020/0006339 A1* | 1/2020 | Sharma | H01L 27/0925 |
| 2020/0007124 A1* | 1/2020 | Matsuura | H03K 17/6872 |
| 2020/0058580 A1* | 2/2020 | Lin | H01L 28/20 |
| 2020/0176441 A1* | 6/2020 | Gorbachov | H01L 27/0288 |
| 2020/0219867 A1* | 7/2020 | Grad | H04L 25/0272 |
| 2020/0335502 A1* | 10/2020 | Mohan | H01L 29/0696 |
| 2021/0125943 A1* | 4/2021 | Lee | H01L 29/41725 |

\* cited by examiner

US 11,502,006 B2

APPARATUSES HAVING AN INTERCONNECT EXTENDING FROM AN UPPER CONDUCTIVE STRUCTURE, THROUGH A HOLE IN ANOTHER CONDUCTIVE STRUCTURE, AND TO AN UNDERLYING STRUCTURE

RELATED PATENT DATA

This patent resulted from a continuation of U.S. patent application Ser. No. 15/835,210, which was filed Dec. 7, 2017, and which is hereby incorporated herein by reference.

TECHNICAL FIELD

Apparatuses having an interconnect extending from an upper conductive structure, through a hole in another conductive structure, and to an underlying structure. CMOS configurations having bias voltage connections extending from upper conductive levels, through one or more conductive elements, and to a diffusion region associated with an underlying semiconductor substrate.

BACKGROUND

Integrated arrangements may include multiple conductive levels over a semiconductor substrate. The conductive levels may be vertically stacked relative to one another such that some conductive levels are under other conductive levels. The conductive levels may comprise wiring or other conductive structures. It may be desired to form an interconnect which extends from a conductive structure of an upper conductive level, through one or more of the lower conductive levels, and to an underlying structure (for instance, a diffusion region associated with the semiconductor substrate). It can be difficult to form such interconnects. If the interconnects serpentine around conductive wiring within the lower conductive levels, the interconnects will be long and will have higher resistance (i.e., increased IR drop) than would shorter interconnects. If instead the interconnects are formed to directly pass through underlying conductive levels, the interconnects will advantageously be short and have desired low resistance. However, the wiring within the underlying conductive levels may end up serpentining around the interconnects and accordingly will be lengthened and have higher resistance than if the wiring were shorter.

It would be desirable to develop new integrated arrangements in which interconnects extend from a conductive structure of an upper conductive level, through one or more lower conductive levels, and to an underlying structure; while avoiding the problems discussed above.

DETAILED DESCRIPTION OF THE ILLUSTRATED EMBODIMENTS

Some embodiments include integrated arrangements having multiple conductive levels over a semiconductor substrate. At least one interconnect extends downwardly from at least one conductive structure associated with an upper conductive level, and couples the conductive structure of the upper conductive level to a structure under the upper conductive level (for instance, to a diffusion region associated with the semiconductor substrate). The interconnect passes through at least one intermediate conductive level which is between the substrate and the upper conductive level; and specifically passes through a hole in a conductive element (e.g., wire) which is associated with the intermediate conductive level. Although conductive elements having holes extending therethrough may have increased resistance as compared to analogous conductive elements lacking such holes, in general it is found that the overall resistance associated with integrated arrangements of the example embodiments described herein is better (i.e., lower) as compared to conventional arrangements (e.g., the conventional arrangements discussed above in the "Background" section of this disclosure).

The arrangements of the example embodiments described herein may be utilized in any suitable applications. For instance, the arrangements may be utilized in CMOS applications. Example embodiments are described with reference to FIGS. 1-4.

Figure 1:
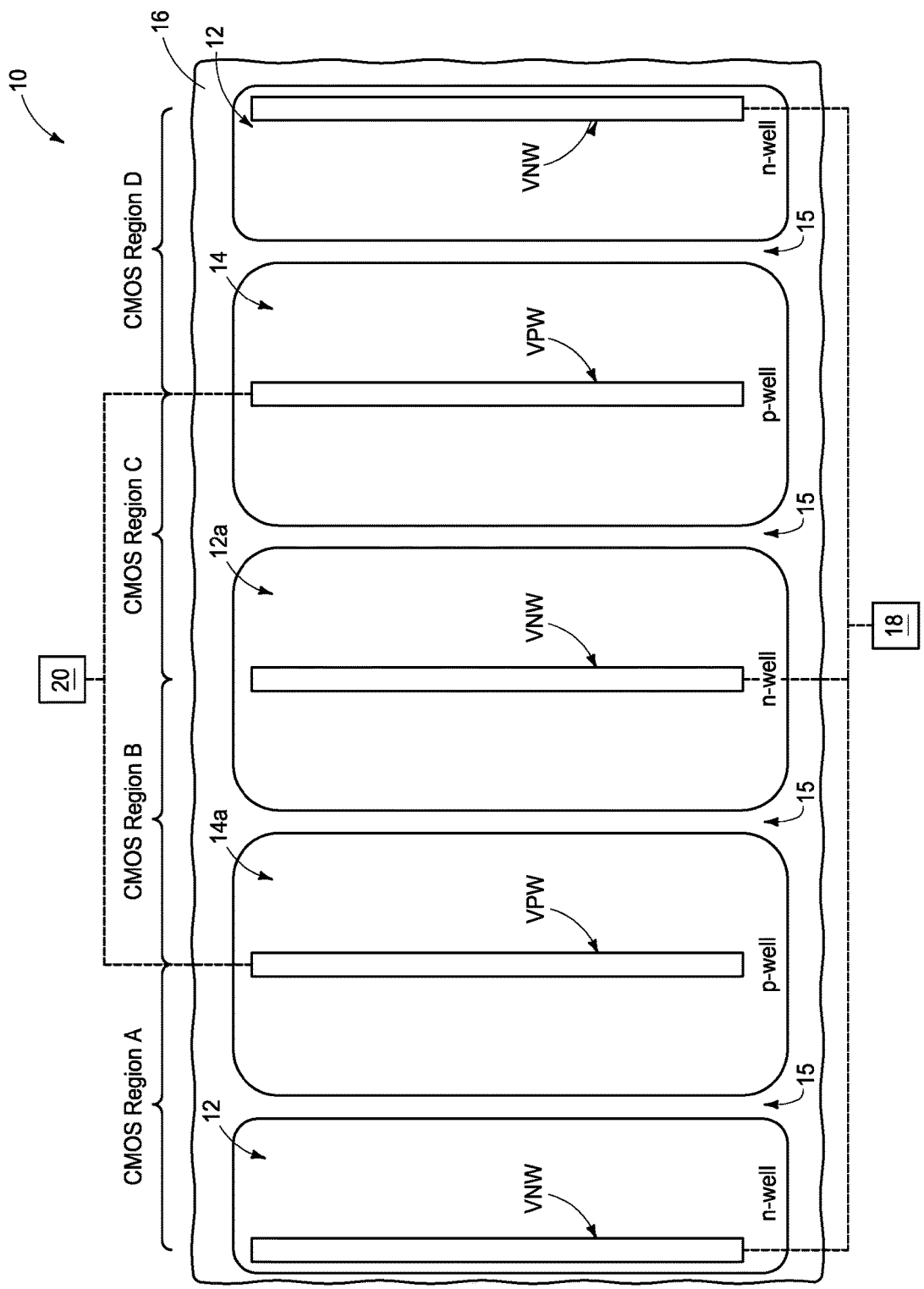
FIG. 1 is a diagrammatic top view of a fragment of an example construction.

Referring to FIG. 1, a construction 10 is shown to comprise n-well regions 12 alternating with p-well regions 14. Intervening regions 15 are shown to be between the n-well regions 12 and the p-well regions 14. The n-well regions 12 are shown to be spaced from the p-well regions 14 in order to clearly show the regions 12 and 14 in the top view of FIG. 1. In practice, the n-well regions 12 may be directly against the p-well regions 14.

The n-well regions 12 and the p-well regions 14 are doped diffusion regions extending into a semiconductor substrate 16. The semiconductor substrate 16 comprises semiconductor material; and may, for example, comprise, consist essentially of, or consist of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the semiconductor substrate 16 may include one or more materials associated with integrated circuit fabrication. Example materials which may be included within the semiconductor substrate 16, are refractory metal materials, barrier materials, diffusion materials, insulator materials, etc.

One of the n-well regions 12 is labeled as region 12a, and one of the p-well regions 14 is labeled as region 14a. The region 12a is substantially identical to the other n-well regions 12, and is called out as region 12a only to enable such region to be specifically identified. Similarly, the region 14a is substantially identical to all other p-well regions 14, and is called out as region 14a only to enable such region to be specifically identified. The term "substantially identical" means identical to within reasonable tolerances of fabrication and measurement.

The n-well region 12a is an immediate neighbor of the p-well region 14a. In some embodiments, the n-well region 12a may be directly adjacent to the immediately neighboring p-well region 14a; and in other embodiments may be spaced from the immediately neighboring p-well region 14a by one or more intervening insulative materials. The term "directly adjacent" means that the n-well region 12a directly contacts the p-well region 14a, rather than being spaced from the p-well region 14a by one or more intervening materials.

PMOS (p-channel metal-oxide semiconductor) transistors may be formed across the n-well regions 12, and NMOS (n-channel metal-oxide semiconductor) transistors may be formed across the p-well regions 14. The PMOS transistors and NMOS transistors may be incorporated into CMOS (complementary metal-oxide semiconductor) devices, with example CMOS configurations being described below with reference to FIGS. 3 and 4.

Referring still to FIG. 1, CMOS regions A, B, C, and D are shown to each comprise a portion of one of the n-well regions 12 together with a neighboring portion of one of the p-well regions 14.

It can be desired to provide n-well bias voltage (VNW) to the n-well regions 12, and to provide p-well bias voltage (VPW) to the p-well regions 14. The VNW and VPW may be utilized to prevent latch-up relative to CMOS, and/or for other purposes. In the illustrated embodiment, the VNW is coupled with circuitry 18 and the VPW is coupled with circuitry 20. The circuitries 18 and 20 are configured to provide appropriate voltages.

The illustrated fragment of construction 10 comprises five of the alternating n-well and p-well regions 12 and 14. Any suitable number of alternating n-well and p-well regions may be utilized across the construction 10.

The alternating n-well and p-well regions 12 and 14 may be utilized for any suitable application(s). For instance, in some applications the alternating regions may be incorporated into CMOS and utilized as part of a logic circuit.

Referring to FIGS. 2, 2A, 2B and 2C, example circuitry is shown provided across the CMOS regions A-D as part of the construction (i.e., assembly, apparatus, structure, architecture, etc.) 10. As a preliminary matter, it is noted that the n-well regions 12 appear to be spaced from the p-well regions 14 by intervening regions 15 in the top view of FIG. 2, but the regions 12 and 14 are directly adjacent to one another in the cross-sectional side views of FIGS. 2A-C. The intervening regions 15 are provided relative to the top view of FIG. 2 in order to enable the regions 12 and 14 to be clearly distinguished from one another. The cross-sectional side views of FIGS. 2A-C more accurately reflect the example embodiment intended to be conveyed by FIGS. 2, 2A, 2B and 2C. However, it should be noted that the invention also includes embodiments in which a p-well region is spaced from a neighboring n-well region by one or more insulative materials; and FIG. 2 may be considered to convey such aspects of the invention.

Figure 2:
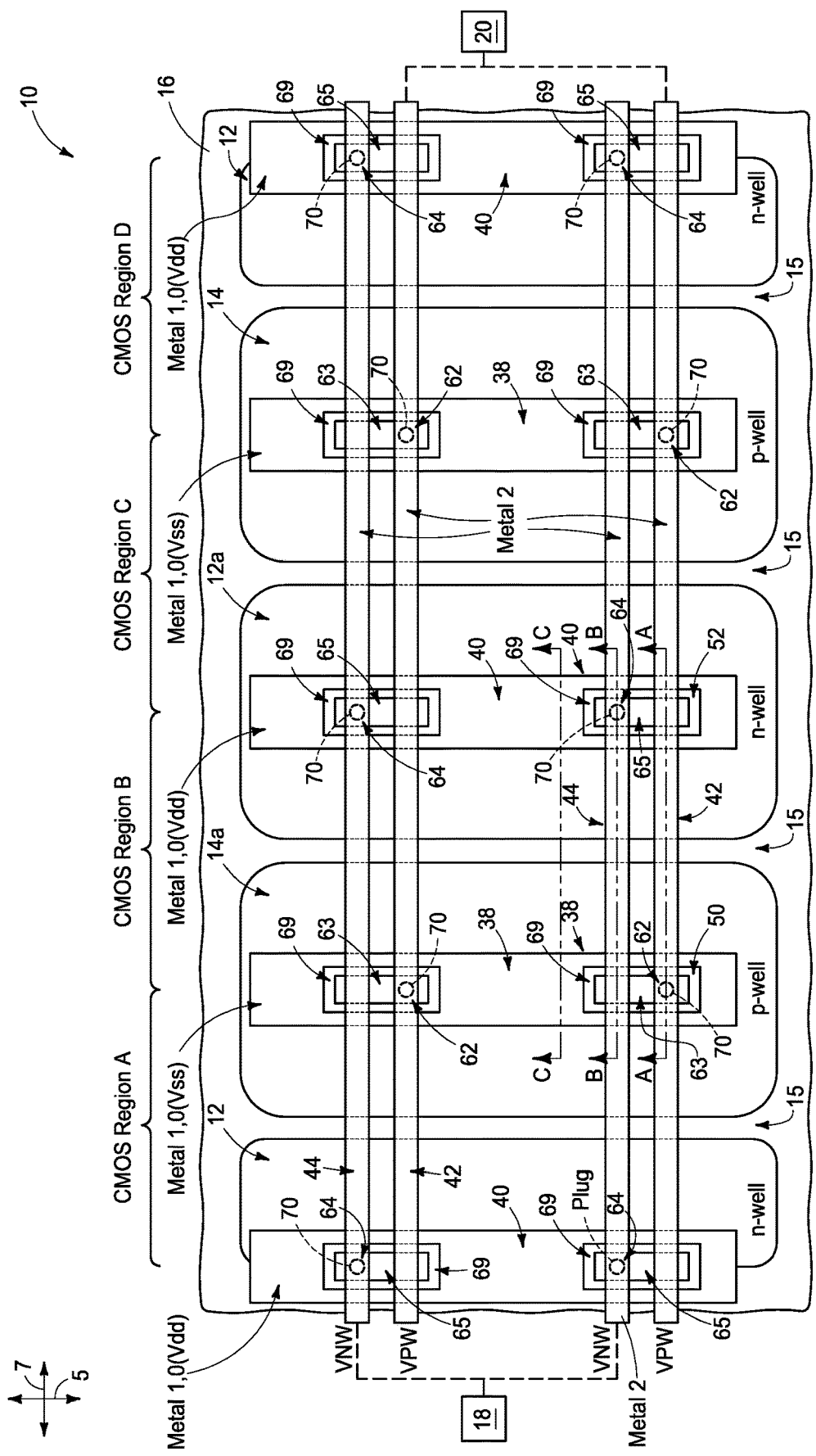
FIG. 2 is a diagrammatic top view of the fragment of FIG. 1, illustrating an example arrangement of circuitry.
Figure 2A:
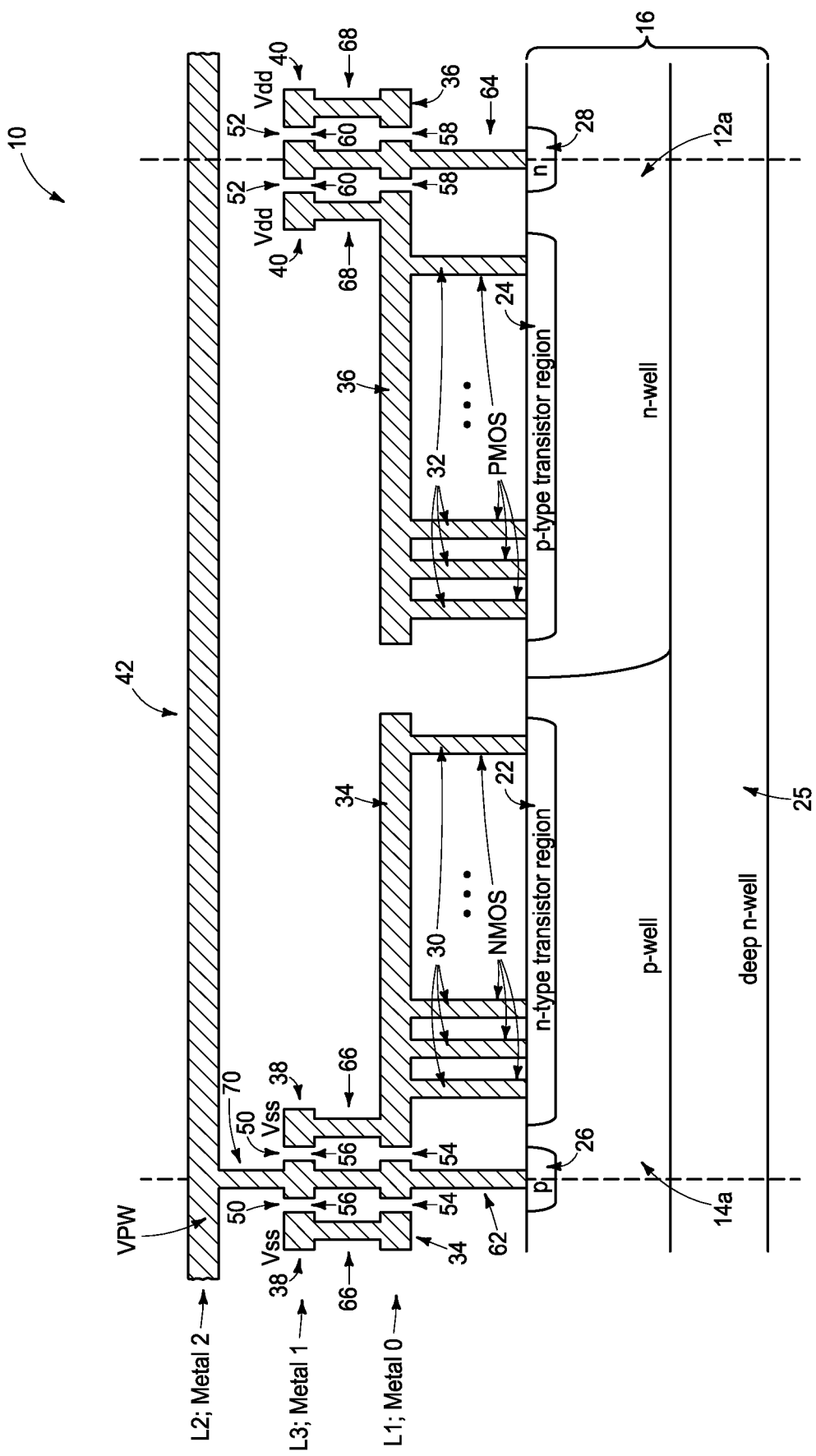
FIGS. 2A, 2B and 2C are diagrammatic cross-sectional side views along the lines A-A, B-B and C-C of FIG. 2, respectively.
Figure 2B:
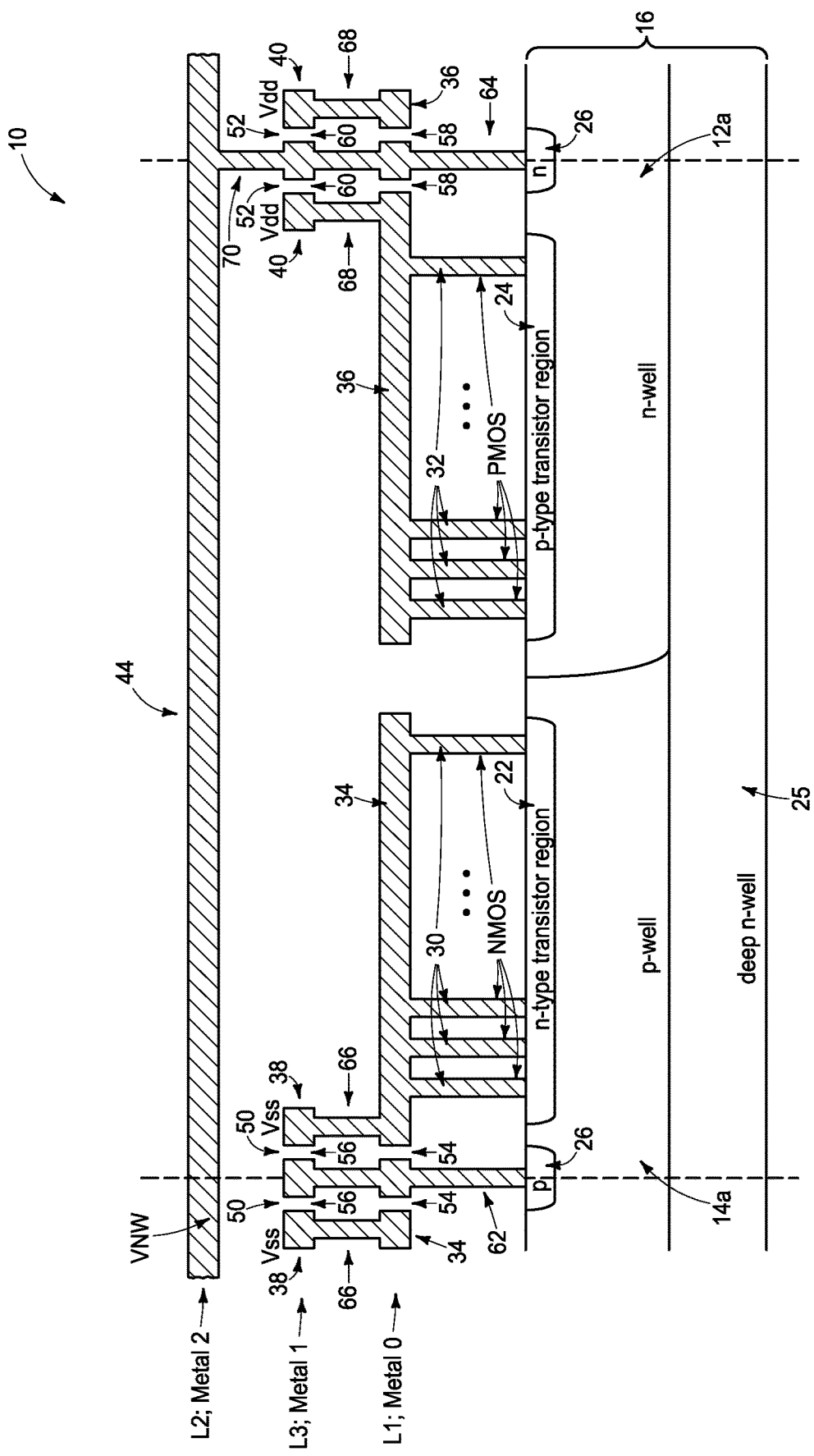
Figure 2C:
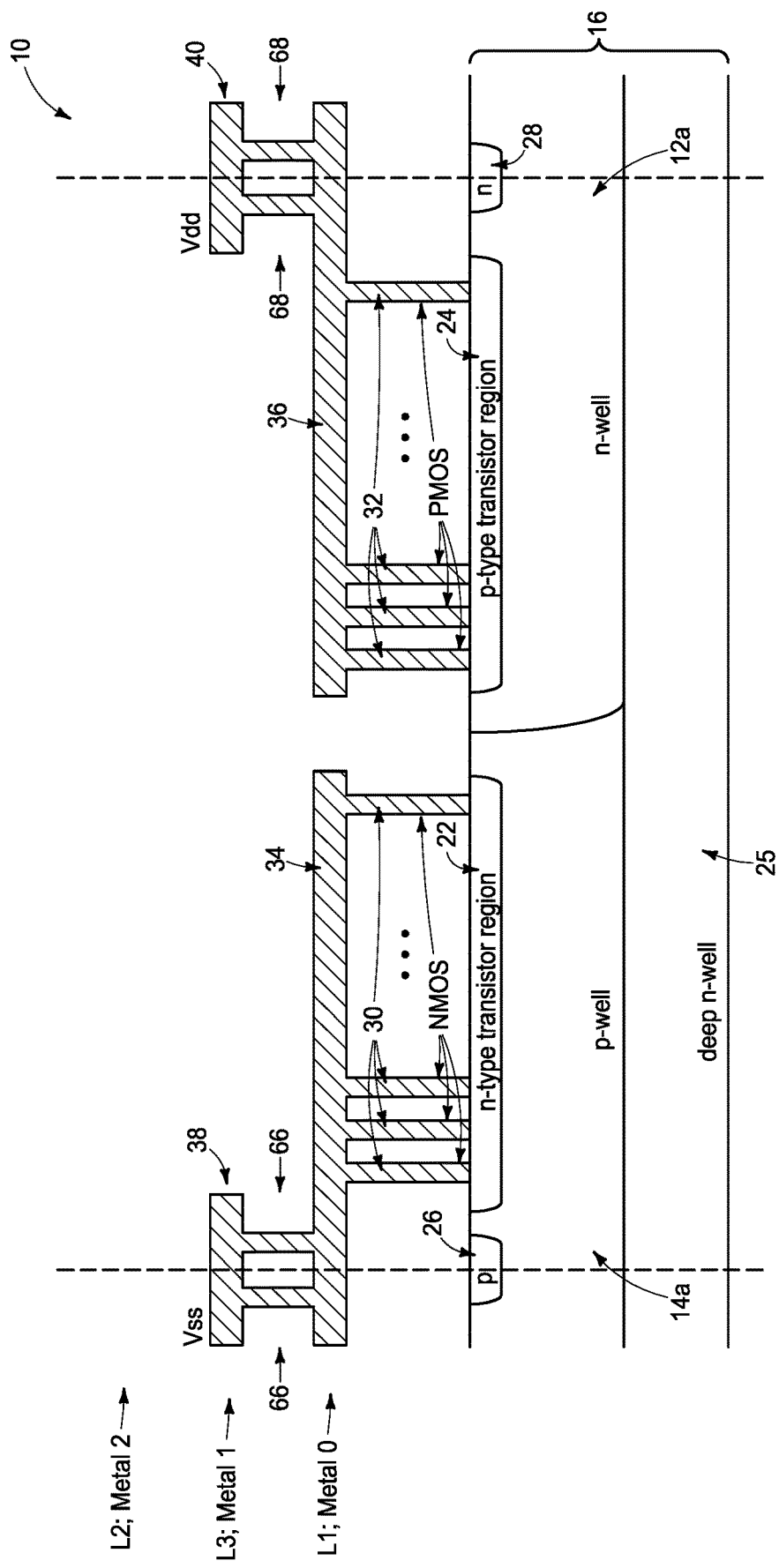

The circuitry of FIGS. 2, 2A, 2B and 2C includes three vertically-stacked conductive levels which are shown in the cross-sectional side views of FIGS. 2A-C as "Metal 0", "Metal 1" and "Metal 2". Each conductive level comprises conductive elements (i.e., conductive structures; such as, for example, wiring), as discussed in more detail below. Although the conductive levels are indicated to be "metal" levels, it is to be understood that the conductive elements within the conductive levels may comprise any suitable conductive materials. For instance, the conductive elements may comprise one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). Thus, although the conductive levels are labeled as "metal" levels, it is to be understood that the conductive levels may include conductive elements which comprise, consist essentially of, or consist of conductively-doped semiconductor material.

The p-well region 14a as illustrated as an example of the p-well regions 14 in the cross-sectional views of FIGS. 2A-C, and the n-well region 12a is illustrated as an example of the n-well regions 12. The p-well region 14a and the n-well region 12a are supported over a deep n-well 25 in the illustrated embodiment.

The cross-sectional views of FIGS. 2A-C show an n-type diffusion region 22 (i.e., an n-type transistor region) extending into the p-well region 14a, and show a p-type diffusion region 24 (i.e., a p-type transistor region) extending into the n-well region 12a. In some embodiments, the regions 22 and 24 may be referred to as diffusion regions which are of opposite type conductivity relative to the wells under the diffusion regions (with p-type and n-type being understood to be of opposite conductivity type relative to one another).

FIGS. 2A-C show that a heavily-doped p-type region 26 extends into the p-well region 14a, and that a heavily-doped n-type region 28 extends into the n-well region 12a.

Circuit elements 30 are diagrammatically illustrated as being associated with the n-type diffusion region 22, and circuit elements 32 are diagrammatically illustrated as being associated with the p-type diffusion region 24. The circuit elements 30 may be understood to be generically representative of circuit elements associated with NMOS transistors (with example NMOS transistors being described below with reference to FIGS. 3 and 4), and the circuit elements 32 may be understood to be generically representative of circuit elements associated with PMOS transistors (with example PMOS transistors being described below with reference to FIGS. 3 and 4).

The first conductive level (the level indicated as "Metal 0" in the cross-sectional views of FIGS. 2A-C) is over the circuit elements 30 and 32. The first conductive level is shown in the cross-sectional views of FIGS. 2A-C to have a first conductive element (i.e., first circuit element) 34 over the p-well region 14a, and to have a second conductive element (i.e., second circuit element) 36 over the n-well region 12a. The first conductive element 34 is electrically coupled with the NMOS circuit elements 30, and the second conductive element 36 is electrically coupled with the PMOS circuit elements 32.

The second conductive level (the level indicated as "Metal 1" in the cross-sectional views of FIGS. 2A-C) comprises the voltage supply lines Vss and Vdd. The voltage supply line Vss may be referred to as a third conductive element (or third circuit element) 38, and the voltage supply line Vdd may be referred to as a fourth conductive element (or fourth circuit element) 40.

The third conductive level (the level indicated as "Metal 2" in the cross-sectional views of FIGS. 2A-C) comprises a fifth conductive element (i.e., fifth circuit element) 42 supplying the p-well bias voltage (VPW), and a sixth conductive element (i.e., sixth circuit element) 44 supplying the n-well bias voltage (VNW).

The levels Metal 0, Metal 1 and Metal 2 are referred to as first, second and third conductive levels, respectively, in the description above. In alternative descriptions, the levels may be identified with different descriptors. For instance, Metal 1 may be referred to as the third level and Metal 2 may be referred to as the second level. FIGS. 2A-2C provide descriptors L1, L3 and L2 adjacent conductive levels Metal 0, Metal 2 and Metal 1, respectively, to specifically indicate an arrangement in which the levels are described as a first conductive level, third conductive level and second conductive level, respectively. In some embodiments, either of the conductive levels Metal 0 and Metal 1 may be considered to be a first conductive level, and the conductive level Metal 2 may be considered to be a second conductive level which is over the first conductive level.

There may be additional conductive levels besides the three conductive levels of FIGS. 2, 2A, 2B and 2C in some embodiments; and there may be only two conductive levels in other embodiments.

A first opening 50 extends through Vss supply line 38 (i.e., conductive element 38), and through the conductive element 34 of level Metal 0, over p-well region 14a. A second opening 52 extends through Vdd supply line 40 (i.e., conductive element 40), and through the conductive element 36 of level Metal 0, over n-well region 12a. The first opening 50 may be considered to comprise a first hole 54 passing through the conductive element 34, and to comprise a second hole 56 passing through the conductive element 38 (with the holes 54 and 56 being shown in FIGS. 2A and 2B). The second opening 52 may be considered to comprise a first hole 58 passing through the conductive element 36, and to comprise a second hole 60 passing through the conductive element 40 (with the holes 58 and 60 being shown in FIGS. 2A and 2B).

In some embodiments, the holes 54 and 58 in openings 50 and 52 may be referred to as first and second holes respectively; and the conductive elements 34 and 36 may be referred to as first and second conductive elements having the holes 54 and 58 passing therethrough.

In some embodiments, the holes 56 and 60 in openings 50 and 52 may be referred to as first and second holes respectively; and the conductive elements 38 and 40 may be referred to as first and second conductive elements having the holes 56 and 60 passing therethrough.

In some embodiments, one of the holes 54 and 58 may be referred to as a first hole, and the other may be referred to as an additional hole. In such embodiments, one of the conductive elements 38 and 40 may be referred to as a first conductive element elevationally above the holes 54 and 58, and the other may be referred to as an additional conductive element elevationally above the holes 54 and 58. In such embodiments, one of the conductive elements 42 and 44 (the VPW and VNW elements) may be referred to as a second conductive element and the other may be referred to as a third conductive element.

In some embodiments, one of the holes 56 and 60 may be referred to as a first hole, and the other may be referred to as an additional hole. In such embodiments, one of the conductive elements 34 and 36 may be referred to as a first conductive element elevationally below the holes 56 and 60, and the other may be referred to as an additional conductive element elevationally below the holes 56 and 60. In such embodiments, one of the conductive elements 42 and 44 (the VPW and VNW elements) may be referred to as a second conductive element and the other may be referred to as a third conductive element.

In some embodiments, the conductive elements 34 and 42 of FIG. 2A may be referred to as first and second conductive elements, respectively; and the conductive element 38 (Vss element) may be referred to as a third conductive element which is elevationally between the first and second conductive elements.

In some embodiments, the conductive elements 36 and 44 of FIG. 2B may be referred to as first and second conductive elements, respectively; and the conductive element 40 (Vdd element) may be referred to as a third conductive element which is elevationally between the first and second conductive elements.

A connecting element (i.e., interconnect) 62 extends from the conductive element 42 (VPW) to the p-type diffusion region 26 associated with the p-well region 14a, as shown in FIG. 2A. Also, a connecting element (i.e., interconnect) 64 extends from the conductive element 44 (VNW) to the n-type diffusion region 28 associated with the n-well region 12a, as shown in FIG. 2B. The connecting element 62 may be considered to extend through the opening 50 to couple the p-well bias voltage (VPW) with the p-well region 14a. Similarly, the connecting element 64 may be considered to extend through the opening 52 to couple the n-well bias voltage (VNW) with the n-well region 12a.

In some embodiments, one of the holes 54 and 56 associated with the first opening 50 may be considered to be a first hole; and one of the holes 58 and 60 associated with the second opening 52 may be considered to be a second hole. The connecting element 62 may be considered to be a first connecting element which extends through the first hole to couple the conductive element 42 (VPW) with the p-well region 14a, and the connecting element 64 may be considered to be a second connecting element which extends through the second hole to couple the conductive element 44 (VNW) with the n-well region 12a. Alternatively, one of the holes 58 and 60 may be considered to be the first hole, one of the holes 54 and 56 may be considered to be the second hole, the connecting element 64 may be considered to be the first connecting element, and the connecting element 62 may be considered to be the second connecting element.

In some embodiments, one of the holes 54 and 56 associated with the opening 50 may be considered to be a first hole; and one of the holes 58 and 60 associated with the opening 52 may be considered to be an additional hole. The connecting element 62 may be considered to be a first connecting element, and the connecting element 64 may be considered to be an additional connecting element.

In some embodiments, one of the holes 58 and 60 associated with the opening 52 may be considered to be a first hole; and one of the holes 54 and 56 associated with the opening 50 may be considered to be an additional hole. The connecting element 64 may be considered to be a first connecting element, and the connecting element 62 may be considered to be an additional connecting element.

In some embodiments, the hole 54 of opening 50 may be considered to be a first hole, and the hole 56 of the opening 50 may be considered to be an additional hole. The connecting element 62 may be considered to pass through both the first hole and the additional hole.

In some embodiments, the hole 58 of opening 52 may be considered to be a first hole, and the hole 60 of the opening 52 may be considered to be an additional hole. The connecting element 64 may be considered to pass through both the first hole and the additional hole.

Notably, FIG. 2B shows that a lower portion of connecting element 62 is present under the conductive element 44 (VNW), but is not coupled with the conductive element 44; and FIG. 2A shows that a lower portion of connecting element 64 is present under the conductive element 42 (VPW), but is not coupled with the conductive element 42.

In the illustrated embodiment of FIGS. 2A-C, additional connecting elements 66 couple the conductive element 38 (Vss) with the conductive element 34; and additional connecting elements 68 couple the conductive element 40 (Vdd) with the conductive element 36.

The top view of FIG. 2 shows that the conductive element 38 (Vss) is configured as a wiring extending primarily along a first direction represented by an axis 5, and that the conductive element 40 (Vdd) is also configured as a wiring extending primarily along the first direction represented by the axis 5. A wiring is described as extending "primarily" along a direction to indicate that the wiring may or may not be straight, but the overall general direction of the wiring is along the stated direction (i.e., the wiring elongates along the stated direction). The top view of FIG. 2 also shows that the p-well bias voltage (VPW) conductive element 42 is configured as a wiring extending primarily along a second direction represented by an axis 7, and that the n-well bias voltage (VNW) conductive element 44 is also configured as a wiring extending primarily along the second direction represented by the axis 7.

The second direction of the axis 7 crosses the first direction of the axis 5, and in the illustrated embodiment is substantially orthogonal to the first direction of the axis 5 (with the term "substantially orthogonal" meaning orthogonal to within reasonable tolerances of fabrication and measurement).

Insulative materials (not shown) would generally be provided between the various conductive elements and interconnects of FIGS. 2, 2A, 2B and 2C, as will be recognized by persons of ordinary skill in the art. The insulative materials are not shown in order to simplify the drawings. The insulative materials may comprise any suitable compositions or combinations of compositions; including, for example, silicon dioxide, silicon nitride, various high-k materials (where high-k means a dielectric constant greater than that of silicon dioxide), etc.

The top view of FIG. 2 shows the connecting elements 62 and 64 configured as pedestals 63 and 65, respectively; with the pedestals 63 and 65 extending downwardly through the openings 50 and 52. In the shown embodiment, the openings 50 and 52 have a rectangular shape (i.e., a rectangular inner periphery), and the pedestals 63 and 65 have rectangular shapes (i.e., rectangular outer peripheries) which nest within the rectangular-shaped openings. Annular insulative regions 69 laterally surround the pedestals 63 and 65. The insulative regions 69 are shown as voids in FIG. 2. In practice, the insulative regions 69 may be filled with any suitable insulative material; such as, for example, one or more of silicon dioxide, silicon nitride, high-k dielectric material, etc.

The annular insulative regions 69 may be considered to be "donut-shaped," in that they are configured as rings.

Although the openings 50 and 52 are shown to be rectangular-shaped in the illustrated embodiment, it is to be understood that the openings may have any suitable shape; such as, for example, round, elliptical, polygonal, etc. The pedestals 63 and 65 may be configured to have shapes complementary to the shapes of the openings so that they nest within the openings analogous to the nested configuration shown in FIG. 2. Alternatively, the pedestals 63 and 65 may have shapes which are not complementary to the internal peripheries of the openings 50 and 52. For instance, in some embodiments the openings may be square (or other polygonal) and the pedestals may be round (e.g., circular or elliptical). As another example, the openings may be round, and the pedestals may be square (or other polygonal).

Plugs 70 are diagrammatically illustrated in the top view of FIG. 2 (and example plugs 70 are shown in the cross-sectional side views of FIGS. 2B and 2C). The plugs 70 are shown in dashed-line view in FIG. 2 in order to differentiate the plugs 70 from the remainder of the pedestals 63 and 65. The plugs 70 connect the pedestals 63 and 65 with an appropriate bias voltage (VPW or VNW). In the shown embodiment, the pedestal 63 is connected with VPW, and the pedestal 65 is connected with VNW.

An advantage of forming the openings 50 and 52 through the conductive elements 34, 36, 38 and 40 (as shown in FIGS. 2, 2A, 2B and 2C) is that the bias voltages (VPW and VNW) may be coupled from the upper level (i.e., the Metal 2 level) to the underlying substrate 16 with reasonable resistance being maintained along all of the conductive levels (i.e., the levels identified as Metal 1, Metal 0 and Metal 2), and along the interconnects 62 and 64. The interconnects 62 and 64 do not serpentine around wiring associated with the lower levels (Metal 0 and Metal 1), and the resistance along the wiring of the lower levels is not substantially altered to accommodate the interconnects 62 and 64. Accordingly, the overall resistance across the various conductive elements and connecting elements of the configuration of FIGS. 2, 2A, 2B and 2C may be kept low as compared to analogous configurations utilizing conventional architectures. Such may advantageously lead to improved performance of configurations of the present invention as compared to conventional configurations. For instance, configurations of the present invention may require less power than conventional configurations, may have improved lifetimes as compared to conventional configurations, may have enhanced speed as compared to conventional configurations, etc.

The illustrated conductive elements (wirings) of FIGS. 2, 2A, 2B and 2C are examples of some of the wirings which may be associated with example embodiment architectures. Persons of ordinary skill in the art will recognize that there may also be additional wirings, such as, for example, wirings for input signals, wirings for output signals, etc.

The configuration of FIGS. 2, 2A, 2B and 2C may be utilized for CMOS; such as, for example, CMOS of logic circuitry. Example CMOS architecture is described with reference to FIGS. 3 and 4.

Figure 3:
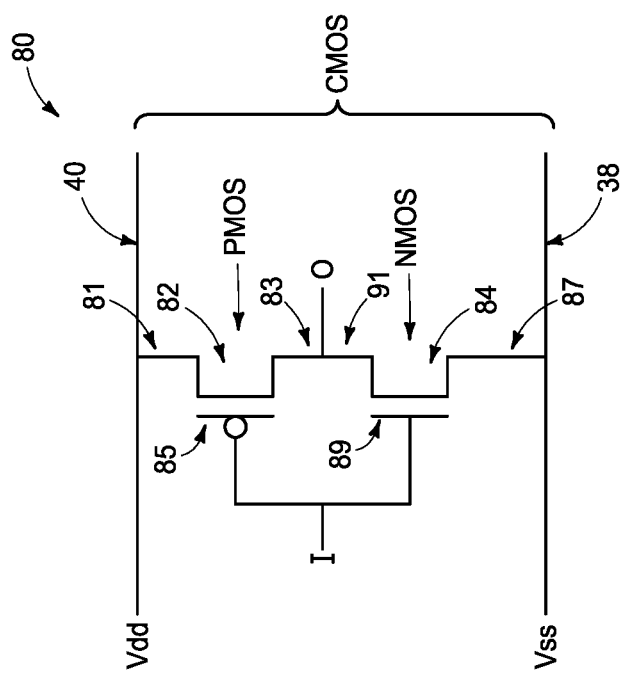
FIG. 3 is a diagrammatic schematic illustration of an example CMOS configuration.

Referring to FIG. 3, an example configuration of CMOS 80 is illustrated with a schematic diagram. The CMOS 80 comprises a PMOS transistor 82 having a first source/drain region 81, a second source/region 83, and a gate 85. The CMOS 80 also comprises an NMOS transistor 84 having a source/drain 91 coupled to the source/drain region 83, having another source/drain region 87, and having a gate 89. The source/drain region 81 of the PMOS transistor 82 is coupled with a Vdd supply 40, and the source/drain region 87 of the NMOS transistor is coupled with a Vss supply 38. The gates 85 and 89 of the transistors 82 and 84 are coupled with an input "I", and the shared source/drain region 83 is coupled with an output "O".

Figure 4:
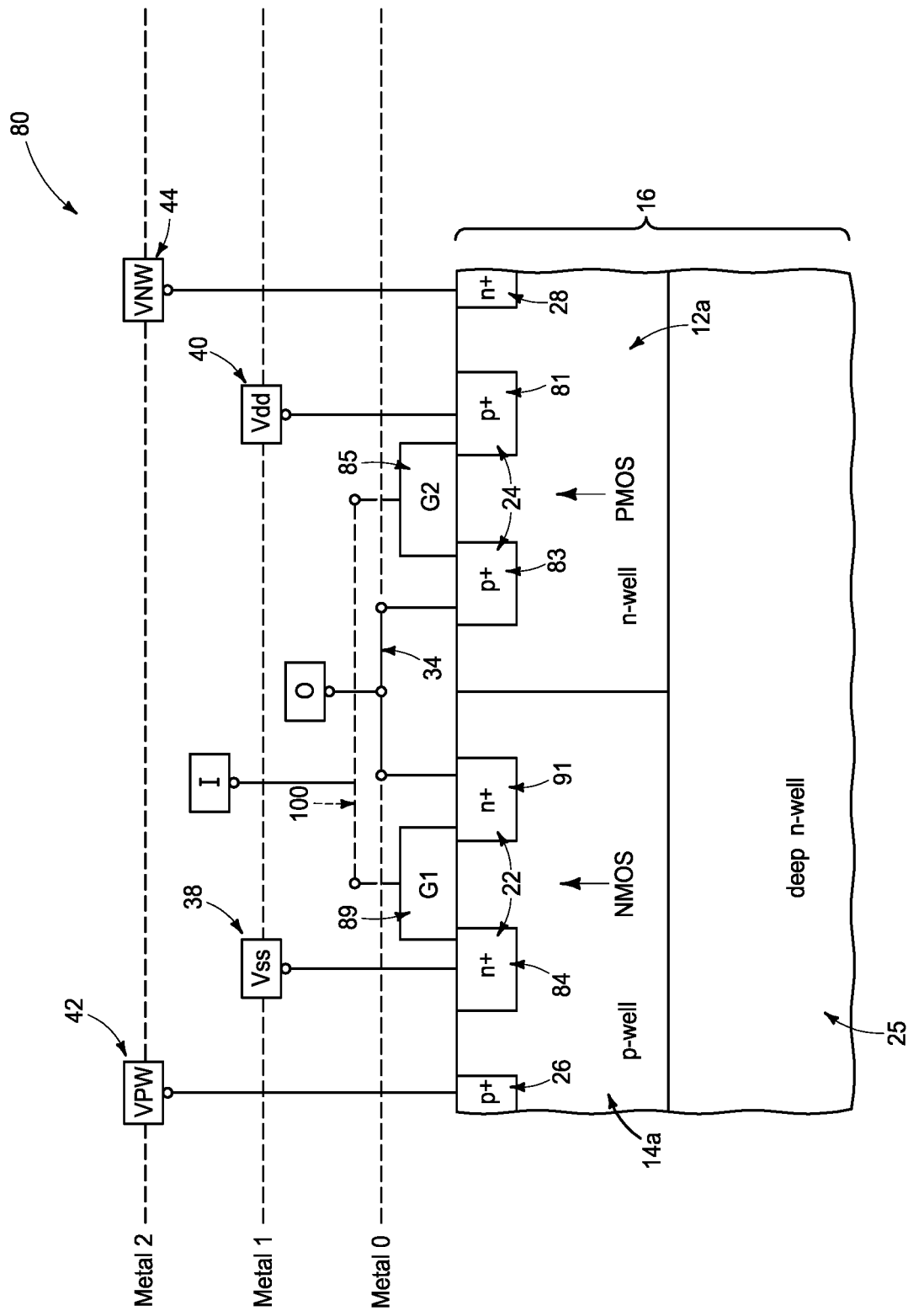
FIG. 4 is a diagrammatic cross-sectional side view of an example CMOS configuration.

The example CMOS 80 is diagrammatically illustrated in FIG. 4 along a cross-sectional view. The conductive levels Metal 0, Metal 1 and Metal 2 are shown in FIG. 4. The NMOS gate 89 is labeled as a gate G1, and the PMOS gate 85 is labeled as a gate G2. The NMOS source/drain regions 84 and 91 are part of the n-type diffusion region 22, and the PMOS source/drain regions 81 and 83 are part of the p-type diffusion region 24.

The source/drain regions 83 and 91 of the CMOS configuration 80 are shown to be coupled with the conductive element 34 along the conductive level of Metal 0, with such conductive element being tied to the output "O". The source/drain regions 84 and 81 of the CMOS configuration 80 extend to supply lines 38 (Vss) and 40 (Vdd); with the supply lines 38 and 40 including wiring which extends along the conductive level Metal 1. Also, the CMOS configuration 80 is shown to comprise the diffusion regions 26 and 28, which are coupled with bias voltages (VPW) and (VNW); with the bias voltage VPW being supplied by wiring 42 which extends along the conductive level of Metal 2, and with the bias voltage VNW being supplied by wiring 44 which extends along the conductive level of Metal 2.

The NMOS gate 89 and the PMOS gate 85 are coupled with a conductive element 100, which in turn is coupled with the input "I". The conductive element 100 is shown with a dashed line to indicate that it may be in any suitable location. For instance, the conductive element 100 may extend along one of the illustrated conductive levels Metal 0, Metal 1 or Metal 2; may extend along a level between two of the illustrated conductive levels; may extend along a level beneath the level of Metal 0; may extend along a level above the level of Metal 2; etc.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an apparatus having a well region extending into a semiconductor substrate. A first conductive element is over the well region and a second conductive element is over the first conductive element. A hole extends through the first conductive element. A connecting element extends from the second conductive element to the well region, and passes through the hole.

Some embodiments include an apparatus having a pair of well regions extending into a semiconductor substrate. One of the well regions is a p-well region, and the other of the well regions is an n-well region. A first conductive level is over the p-well region and is over the n-well region. The first conductive level includes a first conductive element directly over the p-well region, and includes a second conductive element directly over the n-well region. A second conductive level is over the first conductive level. The second conductive level includes a p-well bias voltage and an n-well bias voltage. A first hole passes through the first conductive element. A second hole passes through the second conductive element. A first interconnect extends through the first hole and couples the p-well bias voltage with the p-well region. A second interconnect extends through the second hole and couples the n-well bias voltage with the n-well region.

Some embodiments include an apparatus having a pair of well regions extending into a semiconductor substrate. One of the well regions is a p-well region, and the other of the well regions is an n-well region. An n-type diffusion region is over the p-well region. A p-type diffusion region is over the n-well region. A first conductive level is over the p-well region and is over the n-well region. The first conductive level includes a first conductive element coupled with NMOS transistors associated with the n-type diffusion region, and includes a second conductive element coupled with PMOS transistors associated with the p-type diffusion region. A second conductive level is over the first conductive level. The second conductive level includes a p-well bias voltage and an n-well bias voltage. A first hole passes through the first conductive element. A second hole passes through the second conductive element. A first interconnect extends through the first hole and couples the p-well bias voltage with the p-well region. A second interconnect extends through the second hole and couples the n-well bias voltage with the n-well region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An apparatus comprising:
    a silicon-containing semiconductor substrate;
    a pair of well regions extending into the semiconductor substrate; one of the well regions being a p-well region, and the other of the well regions being an n-well region;
    an n-type diffusion region comprising a transistor region in the p-well region;
    a p-type diffusion region in the n-well region;
    a first conductive level over the p-well region and over the n-well region; the first conductive level comprising a first conductive element coupled with NMOS transistors associated with the n-type diffusion region, and comprising a second conductive element coupled with PMOS transistors associated with the p-type diffusion region;
a second conductive level over the first conductive level; the second conductive level comprising a pair of proximate and parallel lines in the same plane and extending across the p-well region and across the n-well region, one line of the pair being a p-well bias voltage and the other line of the pair being an n-well bias voltage;
a first hole passing through the first conductive level; the first hole being rectangular-shaped and being lined with a first insulative region comprising silicon dioxide;
a second hole passing through the second conductive level; the second hole being rectangular-shaped and being lined with a second insulative region comprising silicon dioxide;
a first interconnect spaced from the transistor region and extending through the first hole and coupling the p-well bias voltage with the p-well region by contacting the p-well region, and from the top view, the first interconnect comprising a pedestal having a rectangular shape that extends perpendicularly to the pair of the parallel lines in the second conductive level, the pedestal having a length that terminates proximate outer sides of the respective parallel lines;
a second interconnect extending through the second hole and coupling the n-well bias voltage with the n-well region; and
a third conductive level elevationally between the first and second conductive levels and comprising a voltage supply line.

2. The apparatus of claim 1, wherein the first and second conductive elements are within a CMOS configuration.

3. The apparatus of claim 1, wherein the p-well region is directly adjacent to the n-well region.

4. The apparatus of claim 1, wherein the third conductive level comprising a third conductive element directly over the p-well region, and comprising a fourth conductive element directly over the n-well region; and wherein:
the first hole passes through the third conductive element; and
the second hole passes through the fourth conductive element.

5. The apparatus of claim 4, wherein the third conductive element is coupled with Vss, and wherein the fourth conductive element is coupled with Vdd.

6. The apparatus of claim 1, wherein the first insulative region comprises a ring structure.

7. The apparatus of claim 1, wherein the first interconnect contacts a heavily-doped diffusion region in the p-well region.

8. The apparatus of claim 1, wherein the p-well region is over a deep well region, the deep well region being a separate and distinct structure from the p-well region.

9. The apparatus of claim 1 further comprising a plurality of discrete circuit elements coupled from the first conductive level to the transistor region, the plurality comprising at least three discrete circuit elements.

10. The apparatus of claim 9 wherein the plurality of the discrete circuit elements comprises at least four discrete circuit elements.

11. The apparatus of claim 1 wherein the first hole in the first insulative region comprises a shape configuration not complimentary to a shape configuration of an outer periphery of the first interconnect.

12. The apparatus of claim 1 wherein an outer periphery of the first interconnect comprises a rectangular shape configuration.

13. The apparatus of claim 1, wherein the voltage supply line comprises a Vdd supply line.

14. The apparatus of claim 1, wherein the voltage supply line comprises a Vss supply line.

15. The apparatus of claim 1, wherein, from the top view, the second interconnect comprises a pedestal having a rectangular shape that extends perpendicularly to the pair of the parallel lines in the second conductive level, the pedestal having a length that terminates proximate outer sides of the respective parallel lines.

16. The apparatus of claim 1, wherein the pair of the parallel lines comprises the uppermost conductive level of the apparatus.

17. The apparatus of claim 1, wherein, from the top view, the voltage supply line of the third conductive level comprises a rectangular shape that extends perpendicularly to the pair of the parallel lines in the second conductive level, the voltage supply line having a length begins under the pair of the parallel lines, the pair being a first pair, the length of the voltage supply line terminates under a second pair of parallel lines, the voltage supply line extending under only the two pairs of the parallel lines.

18. The apparatus of claim 1, wherein the third conductive level comprises conductively-doped semiconductor material.

19. The apparatus of claim 18, wherein the conductively-doped semiconductor material comprises silicon.

20. The apparatus of claim 18, wherein the conductively-doped semiconductor material comprises germanium.

21. The apparatus of claim 1, wherein the second conductive level comprises conductively-doped semiconductor material.

22. The apparatus of claim 21, wherein the conductively-doped semiconductor material comprises silicon.

23. The apparatus of claim 21, wherein the conductively-doped semiconductor material comprises germanium.

24. The apparatus of claim 1, wherein the first conductive level comprises conductively-doped semiconductor material.

25. The apparatus of claim 24, wherein the conductively-doped semiconductor material comprises silicon.

26. The apparatus of claim 24, wherein the conductively-doped semiconductor material comprises germanium.

* * * * *